US010957817B2

United States Patent
Islam et al.

(10) Patent No.: US 10,957,817 B2
(45) Date of Patent: Mar. 23, 2021

(54) POLARIZATION FIELD ASSISTED HETEROSTRUCTURE DESIGN FOR EFFICIENT DEEP ULTRA-VIOLET LIGHT EMITTING DIODES

(71) Applicant: Cornell University, Ithaca, NY (US)

(72) Inventors: Sm Islam, Ithaca, NY (US); Vladimir Protasenko, Ithaca, NY (US); Huili Grace Xing, Ithaca, NY (US); Debdeep Jena, Ithaca, NY (US)

(73) Assignee: Cornell University, Ithaca, NY (US)

( * ) Notice: Subject to any disclaimer, the term of this patent is extended or adjusted under 35 U.S.C. 154(b) by 57 days.

(21) Appl. No.: 16/192,361

(22) Filed: Nov. 15, 2018

(65) Prior Publication Data

US 2019/0148593 A1    May 16, 2019

Related U.S. Application Data

(60) Provisional application No. 62/586,488, filed on Nov. 15, 2017, provisional application No. 62/586,466, filed on Nov. 15, 2017.

(51) Int. Cl.
*H01L 33/32* (2010.01)
*H01L 33/14* (2010.01)
(Continued)

(52) U.S. Cl.
CPC ............. *H01L 33/32* (2013.01); *H01L 27/15* (2013.01); *H01L 33/007* (2013.01);
(Continued)

(58) Field of Classification Search
CPC ....... H01L 33/32; H01L 33/02; H01L 33/007; H01L 33/0025; H01L 33/12; H01L 33/06;
(Continued)

(56) References Cited

U.S. PATENT DOCUMENTS

2011/0235665 A1* 9/2011 Simon ................. H01L 21/0251
372/44.011
2016/0149074 A1 5/2016 Atanackovic et al.
(Continued)

OTHER PUBLICATIONS

Tunnel-injection quantum dot deep-ultraviolet light-emitting diodes with polarization-induced doping in III-nitride heterostructures, Applied Physics Letters 104, 021105 (2014).
(Continued)

*Primary Examiner* — Stephen W Smoot
*Assistant Examiner* — Vicki B. Booker
(74) *Attorney, Agent, or Firm* — Culhane Meadows PLLC; Orlando Lopez

(57) ABSTRACT

A polarization field assisted DUV-LED including a bottom substrate and a n-contact/injection layer formed on the bottom substrate. The n-contact/injection layer includes: a first region for accommodating strain relaxation; a second region for lateral access with a low sheet resistance and higher conductivity compared to the first region to minimize resistive losses and heat generation; and a third region of a graded vertical injection layer with low vertical resistance to minimize heat loss due to vertical resistance. The DUV-LED also includes a p-contact region, and an emitting active region between the n-contact/injection layer and the p-contact region. The injection of electrons and holes into quantum wells proceeds due to tunneling of electrons and holes under the barriers due to less than 2 nm thickness of barriers. This carrier injection lowers the Turn ON voltage of LEDs and reduces heat generation.

18 Claims, 3 Drawing Sheets

(51) Int. Cl.
  *H01L 33/00* (2010.01)
  *H01L 33/02* (2010.01)
  *H01L 27/15* (2006.01)
  *H01L 33/06* (2010.01)
  *H01L 33/12* (2010.01)
  *H01L 33/30* (2010.01)
  *H01L 33/38* (2010.01)

(52) U.S. Cl.
  CPC ...... *H01L 33/0025* (2013.01); *H01L 33/0062* (2013.01); *H01L 33/0075* (2013.01); *H01L 33/02* (2013.01); *H01L 33/025* (2013.01); *H01L 33/06* (2013.01); *H01L 33/12* (2013.01); *H01L 33/14* (2013.01); *H01L 33/30* (2013.01); *H01L 33/325* (2013.01); *H01L 33/38* (2013.01)

(58) Field of Classification Search
  CPC ... H01L 27/15; H01L 33/025; H01L 33/0075; H01L 33/14; H01L 33/38; H01L 33/325; H01L 33/30; H01L 33/0062
  See application file for complete search history.

(56) References Cited

U.S. PATENT DOCUMENTS

2016/0380150 A1* 12/2016 Gaska ............... H01L 33/32
                                                        257/13
2018/0047840 A1   2/2018 Nakamura et al.
2018/0076354 A1   3/2018 Rajan et al.

OTHER PUBLICATIONS

N-polar III-nitride quantum well light-emitting diodes with polarization induced doping, Applied Physics Letters 99, 171104 (2011).
Tunnel-injection GaN quantum dot ultraviolet light-emitting diode, Applied Physics Letter 102, 041103 (2013).

* cited by examiner

POLARIZATION FIELD ASSISTED HETEROSTRUCTURE DESIGN FOR EFFICIENT DEEP ULTRA-VIOLET LIGHT EMITTING DIODES

CROSS-REFERENCE TO RELATED APPLICATIONS

This application claims priority to U.S. Provisional Patent Application No. 62/586,466, filed Nov. 15, 2017, and U.S. Provisional Patent Application No. 62/586,488, filed Nov. 15, 2017, each of which is incorporated herein by reference.

BACKGROUND OF THE INVENTION

1. Field of the Invention

The subject disclosure relates to light-emitting diodes (LEDs), and more particularly to improved efficiency in LEDs.

2. Background of the Related Art

Replacing mercury-based DUV lamps with semiconductor LEDs is environmentally friendly, enables miniaturization, and enhances portability. DUV emission from LEDs using AlGaN multi-quantum well light-emitting active regions has been demonstrated but typically suffers from low external quantum efficiency (EQE), which drops particularly for wavelengths shorter than 240 nm. Several factors contribute to the low EQE such as: growth of LED structures on non-native substrates create large lattice mismatch, leading to dislocation densities; poor doping efficiency; limited light extraction efficiency because of total internal reflection due to refractive index mismatch; and polarization properties of the emitted light that makes light extraction efficiency difficult.

Low internal quantum efficiency (IQE) is also a barrier to product development. IQE decreases due to high densities of threading dislocations and due to the quantum-confined stark effect (QCSE).

SUMMARY OF THE INVENTION

In view of the above, a need exists for technology to fabricate DUV-LEDs with improved EQE and/or IQE.

In one embodiment, the subject technology is a polarization field assisted DUV-LED comprising a bottom substrate, a n-contact/injection layer formed on the bottom substrate. The n-contact/injection layer includes: a first region for accommodating strain relaxation; a second region for lateral access with a low sheet resistance and higher conductivity compared to the first region to minimize resistive losses and heat generation; and a third region of a graded vertical injection layer with low vertical resistance to minimize heat loss due to vertical resistance. The DUV-LED also includes a p-contact region and an emitting active region between the n-contact/injection layer and the p-contact region. Preferably, the bottom substrate is Aluminum-Nitride (AlN) and the first region is a n-AlGaN region fabricated of a compositionally graded buffer region doped with n-type chemical impurity of a thickness in a range of 100-500 nanometer (nm). In the first region, an Aluminum content may be linearly graded down from a start value of 100% to an end value of 70% near the emitting active region. The second region may be a n-AlGaN region fabricated of a constant composition heavily impurity doped AlGaN lateral access region of a thickness greater than 1 micron. The third region can be a compositionally graded polarization doped AlGaN layer with n-type impurity having a thickness between about 100-200 nm.

Preferably, the contact region includes: a graded p-type vertical injection layer adjacent the emitting active region; and a vertical tunnel injection layer on top of the graded p-type vertical injection layer. To form the graded p-type vertical injection layer, molecular beam epitaxy p-AlGaN layers are grown at a temperature of about 650° C. or more; and a growth temperature for the vertical tunnel injection layer is approximately 730° C. The DUV-LED may further include a first metal contact attached to the first layer, a second metal contact attached to the contact region, a battery connected between the first and second metal contacts, and a monolithic FET switch connected in series with the battery for generating pulsed operation of the DUV-LED for thermal management.

In another embodiment, the subject technology is directed to a polarization field assisted DUV-LED including a bottom substrate, a n-contact/injection layer formed on the bottom substrate, a p-contact region, an emitting active region between the n-contact/injection layer and the p-contact region, a first metal contact attached to the first layer, a second metal contact attached to the contact region, a battery connected between the first and second metal contacts, and a monolithic FET switch connected in series with the battery for generating pulsed operation of the DUV-LED for thermal management. The n-contact/injection layer can includes a first region for accommodating strain relaxation. The n-contact/injection layer can also include a second region for lateral access with a low sheet resistance and higher conductivity compared to the first region to minimize resistive losses and heat generation. The n-contact/injection layer can also include a third region of a graded vertical injection layer with low vertical resistance to minimize heat loss due to vertical resistance.

Still another embodiment is a LED with enhanced EQE comprising compositionally graded AlGaN contact layers doped with chemical impurities for carrier injection from p and n regions to enhance a doping efficiency and thus improve injection efficiency. The contact layers can be formed by compositionally graded polarization-induced-doping. Preferably, the contact layers are field ionized and further comprising a p-contact layer including polarization field assisted tunnel junctions. A n-contact layer may include 3 distinct AlGaN regions of: a compositionally graded buffer region doped with n-type chemical impurity to accommodate strain relaxation; a constant composition heavily impurity doped thick AlGaN lateral access region; and a compositionally graded polarization doped layer with n-type impurity as a vertical injection layer. The LED may further include a deep-UV light emitting active region composed of ultra-thin GaN/AlN quantum structures with high internal quantum efficiency due to improved electron-hole overlap. The LED can include a deep-UV light emitting active region composed of ultra-thin GaN/AlN quantum structures with high light extraction efficiency due to TE dominated light emission toward top surface of LED device.

It should be appreciated that the subject technology can be implemented and utilized in numerous ways, including without limitation as a process, an apparatus, a system, a device, a method for applications now known and later developed. These and other unique features of the system disclosed herein will become more readily apparent from the following description and the accompanying drawings.

BRIEF DESCRIPTION OF THE DRAWINGS

So that those having ordinary skill in the art to which the disclosed technology appertains will more readily understand how to make and use the same, reference may be had to the following drawings.

DETAILED DESCRIPTION OF PREFERRED EMBODIMENTS

Figure 1:
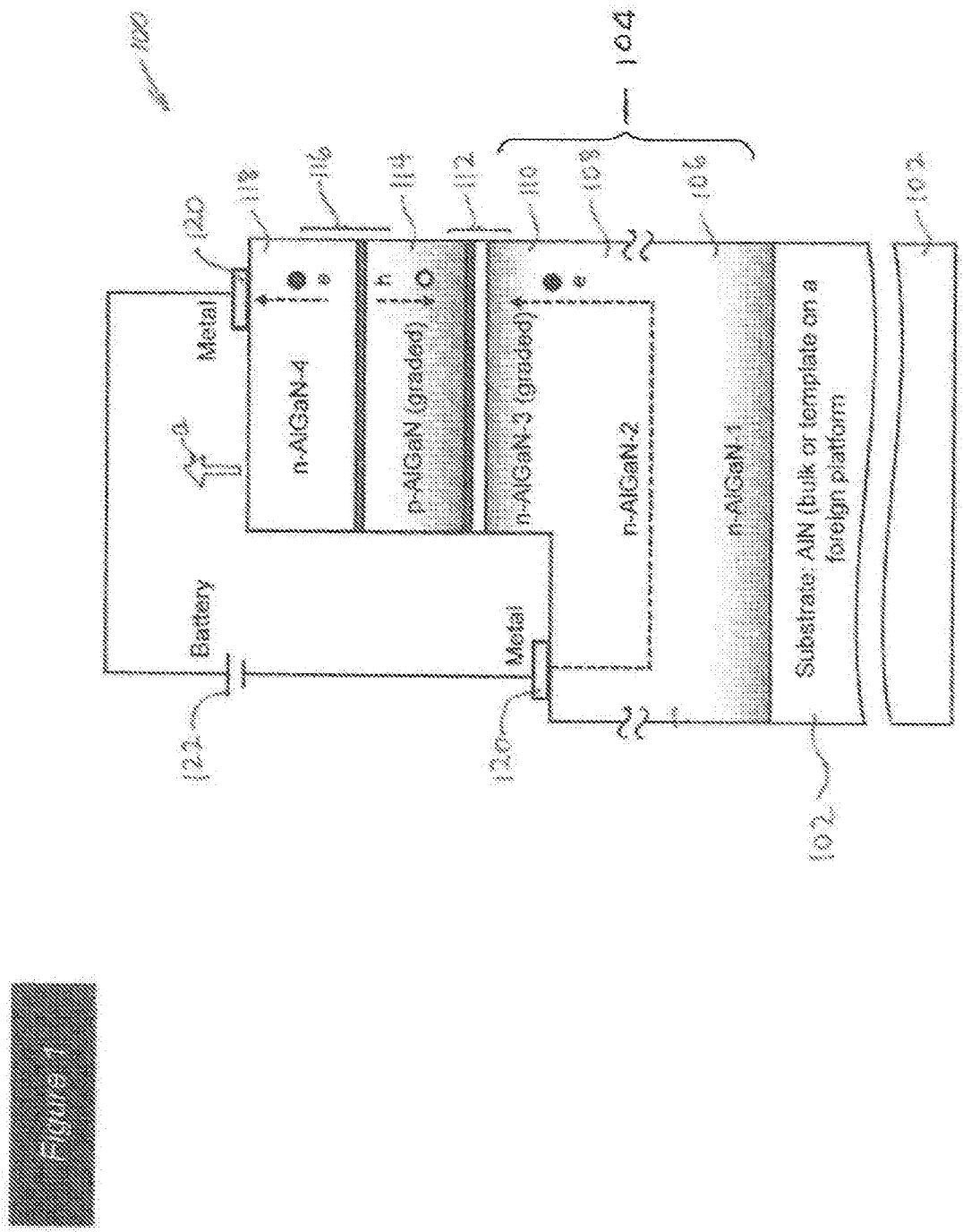
FIG. 1 is a schematic diagram of a DUV-LED in accordance with the subject disclosure.

The subject technology overcomes many of the prior art problems associated with DUV LEDs. The advantages, and other features of the technology disclosed herein, will become more readily apparent to those having ordinary skill in the art from the following detailed description of certain preferred embodiments taken in conjunction with the drawings which set forth representative embodiments of the present technology and wherein like reference numerals identify similar structural elements. Directional indications such as upward, downward, right, left, bottom, top and the like are used with respect to the figures and not meant in a limiting manner.

In brief overview, the subject technology realizes deep UV LEDs (DUV-LEDs) with design and crystal growth methods using molecular beam epitaxy (MBE). For example, the DUV-LED consists of a n-doped injection region, a p-doped injection region with polarization field-assisted doping with ternary AlGaN (Aluminum-Gallium-Nitride) wide bandgap material and a light emitting active region consisting of quantum hetero-structures to create enhanced wall-plug-efficiency for DUV LEDs by reducing carrier injection losses.

Referring now to the FIG. 1, there is shown schematically a polarization field assisted DUV-LED 100 in accordance with the subject technology. The DUV-LED 100 is a layered structure having a bottom substrate 102. The bottom substrate 102 can be Aluminum-Nitride (AlN) single crystal or AlN template on a foreign substrate. A n-contact/injection layer 104 is formed directly on top of the bottom substrate 102. The n-contact/injection layer 104 includes three distinct AlGaN regions 106, 108, 110.

The first region 106 is preferably a n-AlGaN region fabricated of a compositionally graded buffer region doped with n-type chemical impurity to accommodate strain relaxation. The thickness of the first region 106 is preferably 100-500 nanometer (nm). For a metal polar AlGaN surface, the Aluminum content is linearly graded down from a start value of 100% to an end value of 70% near the light emitting active region for a 260 nm LED. The terminal composition of the Aluminum is decided based on the emission wavelength of the DUV-LED to ensure transparency. It can be less than 70%, say 50%, for a longer emission wavelength of 280 nm.

The second region 108 is preferably a n-AlGaN region fabricated of a constant composition heavily impurity doped thick AlGaN lateral access region. Preferably, the impurity doping is a Silicon concentration of approximately $5 \times 10^{18}$ $cm^{-3}$. The thickness of the second region 108 is preferably greater than 1 micron. The second region 108 is a lateral access region that ensures the lateral electronic charge carriers access the third region 110, which is a light emitting active region. The heavy impurity doping of the second region 108 provides a low sheet resistance and higher conductivity to minimize resistive losses and heat generation.

The third region 110 is a graded vertical injection layer. The third region 110 is preferably a compositionally graded polarization doped AlGaN layer with n-type impurity. For a metal polar AlGaN surface, the Aluminum content is linearly graded up to 100% near the light emitting active region 112. The thickness of the third region 110 is preferably between about 100-200 nm. The third region 110 provides low vertical resistance to minimize the heat loss due to vertical resistance.

Preferably, the emitting active region 112 includes ultra-thin GaN/AlN quantum well (dot)/barrier quantum structures for high internal quantum efficiency due to better electron-hole wave function overlap compared to conventional thick AlGaN quantum wells as well as high light extraction efficiency due to TE dominated light emission from GaN toward top LED surface compared to TM dominated light emission from the conventional thick AlGaN quantum wells toward LED edges. As shown in FIG. 1, the light is emitted vertically as represented by arrow a, which is a preferred direction for extraction.

Still referring to FIG. 1, the DUV-LED 100 includes contact region 116. The contact region 116 includes a graded p-type vertical injection layer 114 above the emitting active region 112. To form the graded p-type vertical injection layer 114, MBE p-AlGaN layers are grown at a temperature of 650° C. or less to account for p-dopant (i.e., Magnesium) out-diffusion. By using the compositionally graded p-AlGaN for the graded p-type vertical injection layer 114, the MBE crystal growth temperature is increased compared to conventional constant Al-containing p-AlGaN without compromising the conductivity. The elevated growth temperature enhances the crystal quality and, in turn, improves the vertical carrier transport property. The Al-content for the graded layer needs to be chosen based on the emission wavelength to ensure transparency. The thickness of the p-graded layer determines the grading gradient and eventually the vertical conductivity due to polarization charges. For example, for a 260 nm DUV LED, a 50 nm thick graded p-AlGaN with 100% Al content near the active region and 60% p-AlGaN further from the active region will provide decent vertical conductivity.

The contact region 116 also includes a vertical tunnel injection layer 118 on top of the graded p-type vertical injection layer 114. Layer 118 is a compositionally graded n-AlGaN layer with additional chemical impurity for enhanced vertical conductivity. For a 260 nm DUV LED, the Al-content for the 118 region can be graded from 60% Al to 95% near the top interface for a metal-polar substrate. The thickness of the 118 layer can be 100 nm. Between the 118 and 114 layers, a 10 nm GaN quantum well can be introduced to reduce the tunneling distance. The growth temperature for one or more layers of the contact region 116 can be increased, for example to 730° C. The elevated growth temperature enhances the crystal quality and thus the carrier transport property. The growth temperature can be the same temperature used for growing AlGaN layers such as the first layer 104. The DUV-LED 100 includes two metal contacts 120 attached to the first layer 104 and contact region 116, respectively, with a battery 122 connected between the metal contacts 120.

It can be seen that the DUV-LED 100 has built-in polarization charge of polar III-N crystals to circumvent the fundamental material related doping challenges that cause limited EQE. The compositionally graded AlGaN contact layers are further doped with chemical impurities for carrier injection from the p and n regions to enhance doping efficiency and thus improve the injection efficiency. Such field ionization makes operation of the DUV-LED 100 temperature independent as well. According, the DUV-LED 100 can function well at cryogenic temperatures.

In operation, battery 122 supplies voltage between metal contact 120 on top of layer 118 (positive terminal) and metal contact 120 on top of layer 108 (negative terminal). Under such conditions, the tunneling junction 116 will be under reverse bias and LED comprised of p-layer 116, active area 116, and n-layer 108 and region 110 under forward bias. The reverse bias allows injection of holes from layer 118 into p-AlGaN 114 and electrons into layers 108 and region 110. Due to low resistivity of the layers 108, 110, 114, the electrons and holes drift to active area 112. In the active area 112, electrons and holes localize in GaN quantum well (dots, discs) and either radiatively or non-radiatively recombine. Preferably, all recombination proceeds radiatively and photons are generated. Upon the event of photon generation, photons can exit the device 100 in all directions. For light generated in ultra-thin GaN layers, light propagation in a vertical direction (toward layers 118 or 106) is preferable, as it is indicated by arrow a.

Figure 2:
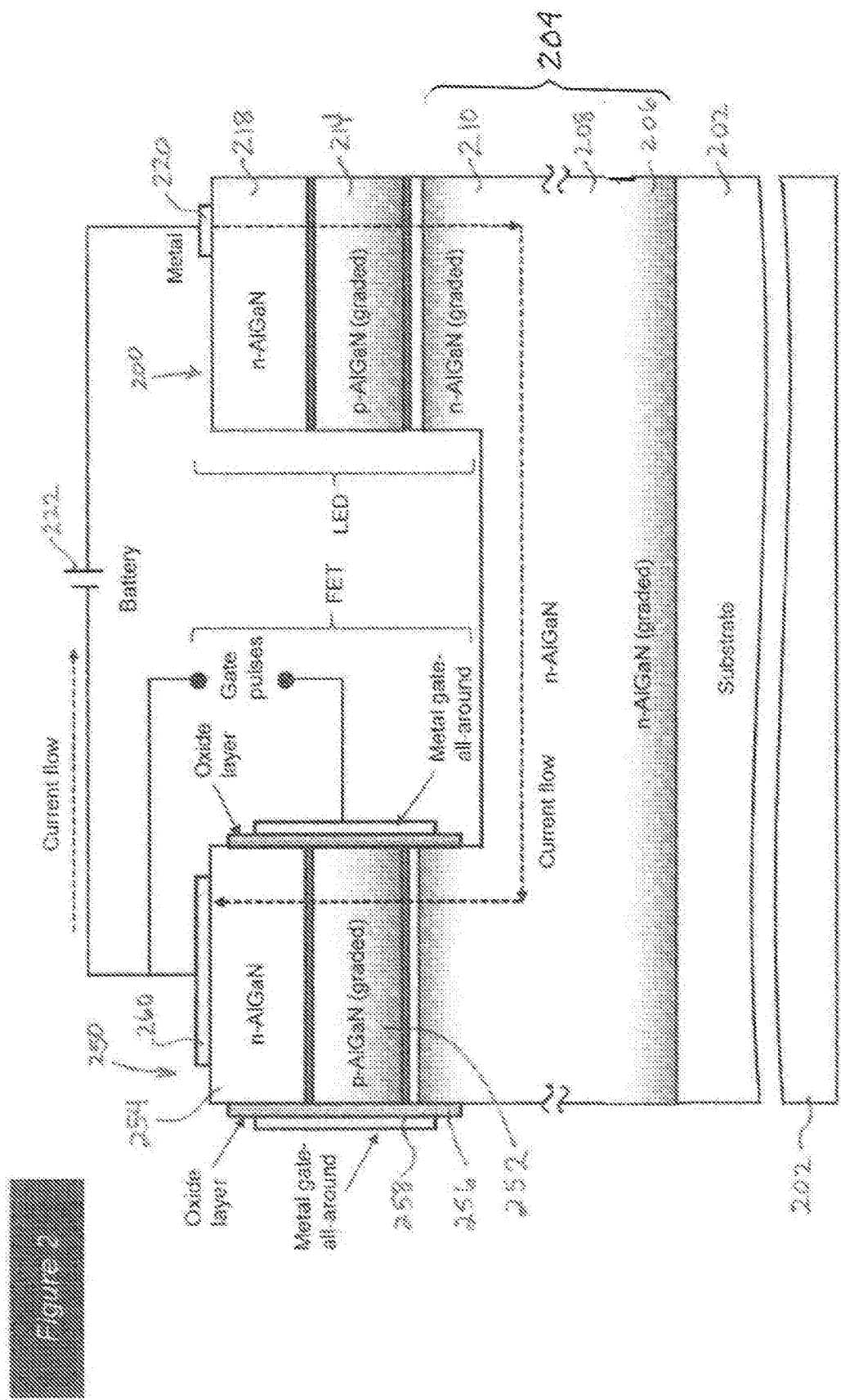
FIGS. 2 and 3 are schematic diagrams of a DUV-LED with an integrated FET switch connected in series in accordance with the subject disclosure.

Referring now to FIG. 2, there is shown a schematic diagram of a DUV-LED assembly with an integrated FET switch 250 connected in series with a DUV-LED 200 in accordance with the subject disclosure. Similar elements to those described in connection with the DUV-LED 100 described above are indicated with the like reference numbers in the 200 series. Many elements are essentially the same as those of the foregoing embodiments and, thus, are not further described herein.

Due to low wall plug efficiency (WPE) for DUV-LEDs, typically less than 10%, heat management is a challenge. A variety of various mechanisms to accomplish pulsed operation can be adapted to the device 100 for heat management. In one embodiment, a monolithic FET switch 250 is integrated in series to the DUV-LED 200 to run in a pulsed-mode. The pulsed operation allows for proper thermal management of the DUV-LED 200, which leads to enhanced lifetime and operation hours for the DUV-LED 200.

The FET switch 250 includes a graded p-AlGaN layer 252 similarly formed to layer 214. The graded p-AlGaN layer 252 is also formed on the region 210. A n-AlGaN layer 254 is formed on the graded p-AlGaN layer 252 in a similar manner to layer 218. To form the FET switch 250, an oxide layer 256 then a metal gate-all-around 258 are formed on the layers 210, 252, 254. A metal contact 260 is also formed on the n-AlGaN layer 254 for connection to the battery 222. Gate pulses are applied to the metal gate-all-around 258 to accomplish the pulsed operation. This is one way to incorporate the FET switch with the LED but other ways are also possible to achieve the pulsed operation.

In operation, vertical metal oxide semiconductor field effect transistor (VMOSFET) 250 comprised of items 252, 254, 256, 258, 260 is connected to LED structure (items 210, 214, 218, 220) by an n-type channel (e.g., layers 204, 206, and 208). The VMOSFET 250 operates in enhancement mode (E-mode). Under positive gate-source voltage Vgs, a conductive channel for electrons is formed under the gate 258 and resistivity between n-AlGaN layers 254 and layers 204, 206, 208, 210 becomes small. It is equivalent to shortening layer 210 to the negative terminal of battery 222 and the LED is in the ON state. Under negative voltage on the gate 258, the channel under the gate is depleted (electrons pushed away by negative potential on the gate) and channel resistivity is high. Since the VMOSFET 250 is in series with the LED structure, only small current can flow through the LED and the LED is in the OFF state. By switching gate voltage between positive and negative potentials, the LED switches between the ON and OFF states. By varying duration of the ON state, the amount of heat generated by LED can be controlled.

Figure 3:
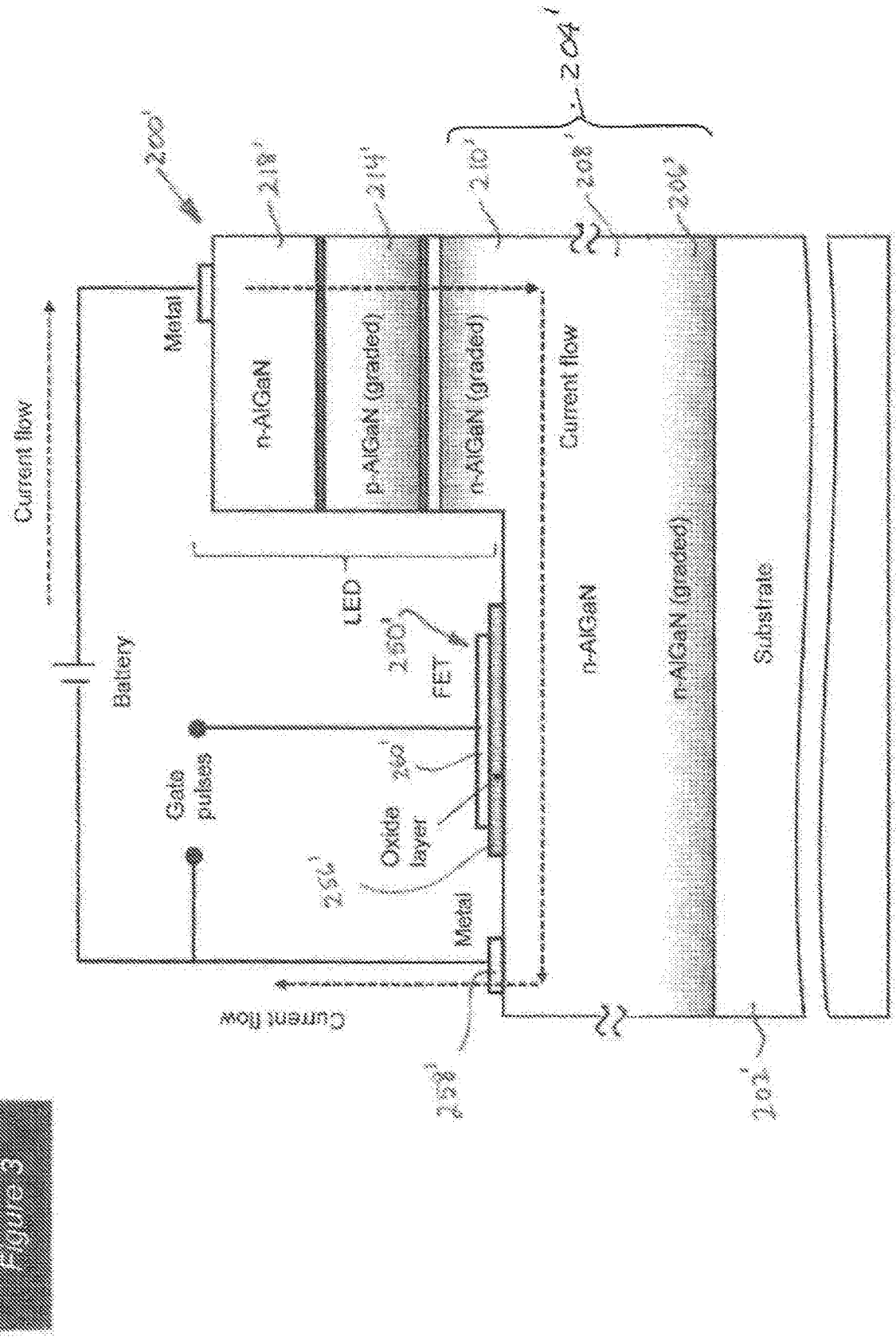

FIG. 3 is also a schematic diagram of a DUV-LED assembly with an integrated FET switch 250' connected in series with a DUV-LED 200' in accordance with the subject disclosure. The elements are similar to those described in connection with FIG. 2 above and indicated with the like reference numbers. Many elements are essentially the same as those of the foregoing embodiments and, thus, are not further described herein.

While the subject technology has been described with respect to preferred embodiments, those skilled in the art will readily appreciate that various changes and/or modifications can be made to the subject technology without departing from the spirit or scope thereof. For example, each claim may depend from any or all claims in a multiple dependent manner even though such has not been originally claimed. Further, a manuscript and appendix are attached hereto that provides additional information regarding the subject technology.

What is claimed is:

1. A polarization field assisted DUV-LED comprising:
   a bottom substrate;
   a n-contact/injection layer formed on the bottom substrate, the n-contact/injection layer
   including: a first region for accommodating strain relaxation; a second region for lateral access with a low sheet resistance and higher conductivity compared to the first region to minimize resistive losses and heat generation; and a third region of a graded vertical injection layer with low vertical resistance to minimize heat loss due to vertical resistance;
   a p-contact region; and
   an emitting active region between the n-contact/injection layer and the p-contact region.

2. A DUV-LED as recited in claim 1, wherein:
   the bottom substrate is Aluminum-Nitride (AlN); and
   the first region is a n-AlGaN region fabricated of a compositionally graded buffer region doped with n-type chemical impurity of a thickness in a range of 100-500 nanometer (nm).

3. A DUV-LED as recited in claim 1, wherein in the first region, an Aluminum content is linearly graded down from a start value of 100% to an end value of 70% near the emitting active region.

4. A DUV-LED as recited in claim 1, wherein the second region is a n-AlGaN region fabricated of a constant composition heavily impurity doped AlGaN lateral access region of a thickness greater than 1 micron.

5. A DUV-LED as recited in claim 1, wherein the third region is a compositionally graded polarization doped AlGaN layer with n-type impurity having a thickness between about 100-200 nm.

6. A DUV-LED as recited in claim 1, wherein the p contact region includes: a graded p-type vertical injection layer adjacent the emitting active region; and a vertical tunnel injection layer on top of the graded p-type vertical injection layer.

7. A DUV-LED as recited in claim 6, wherein:
to form the graded p-type vertical injection layer, molecular beam epitaxy p-AlGaN layers are grown at a temperature of about 650° C. or more; and
a growth temperature for the vertical tunnel injection layer is approximately 730° C.

8. A DUV-LED as recited in claim 1, further comprising
a first metal contact attached to one of the first or second region of the n-contact/injection layer;
a second metal contact attached to the p contact region;
a battery connected between the first and second metal contacts; and
a monolithic FET switch connected in series with the battery for generating pulsed operation of the DUV-LED for thermal management.

9. A LED with enhanced EQE comprising:
compositionally graded AlGaN contact layers doped with chemical impurities for carrier injection from p and n regions to enhance a doping efficiency and thus improve injection efficiency; wherein an n-contact layer includes three distinct AlGaN regions of: a compositionally graded buffer region doped with n-type chemical impurity to accommodate strain relaxation; a constant composition heavily impurity doped thick AlGaN lateral access region; and a compositionally graded polarization doped layer with n-type impurity as a vertical injection layer.

10. A LED as recited in claim 9, wherein the compositionally grades contact layers are formed by compositionally graded polarization-induced-doping.

11. A LED as recited in claim 9, wherein the contact layers are field ionized and further comprising a p-contact layer including polarization field assisted tunnel junctions.

12. A LED as recited in claim 9, further comprising a deep-UV light emitting active region composed of ultra-thin GaN/AlN quantum structures with high internal quantum efficiency due to improved electron-hole overlap.

13. A LED as recited in claim 9, further comprising a deep-UV light emitting active region composed of ultra-thin GaN/AlN quantum structures with high light extraction efficiency due to TE dominated light emission towards top surface of the LED device.

14. A LED with enhanced EQE comprising:
compositionally graded AlGaN contact layers doped with chemical impurities for carrier injection from p and n regions to enhance a doping efficiency and thus improve injection efficiency; wherein the compositionally graded AlGaN contact layers are field ionized and further comprising a p-contact layer including polarization field assisted tunnel junctions.

15. A polarization field assisted DUV-LED comprising:
a bottom substrate;
a n-contact/injection layer formed on the bottom substrate;
a p-contact region; the p-contact region including polarization field assisted tunnel junctions;
the n-contact/injection layer and the p-contact region being field ionized;
an emitting active region between the n-contact/injection layer and the p-contact region;
a first metal contact attached to one region of the n-contact/injection layer;
a second metal contact attached to the p-contact region;
a battery connected between the first and second metal contacts; and
a monolithic FET switch connected in series with the battery for generating pulsed operation of the DUV-LED for thermal management.

16. A DUV-LED as recited in claim 15, wherein the n-contact/injection layer includes: a first region for accommodating strain relaxation.

17. A DUV-LED as recited in claim 15, wherein the n-contact/injection layer includes: a second region for lateral access with a low sheet resistance and higher conductivity compared to the first region to minimize resistive losses and heat generation.

18. A DUV-LED as recited in claim 15, wherein the n-contact/injection layer includes: a third region of a graded vertical injection layer with low vertical resistance to minimize heat loss due to vertical resistance.

* * * * *